United States Patent [19]
Bartholomew et al.

[11] Patent Number: 5,629,952
[45] Date of Patent: *May 13, 1997

[54] PACKAGING OF HIGH POWER SEMICONDUCTOR LASERS

[75] Inventors: Roger F. Bartholomew, Painted Post; Paul A. Jakobson, Corning; Douglas W. Hall, Corning; Julia A. Sharps, Corning, all of N.Y.

[73] Assignee: Corning Incorporated, Corning, N.Y.

[*] Notice: The term of this patent shall not extend beyond the expiration date of Pat. No. 5,392,305.

[21] Appl. No.: 481,008

[22] Filed: Jun. 7, 1995

Related U.S. Application Data

[60] Division of Ser. No. 168,125, Dec. 17, 1993, Pat. No. 5,513,198, which is a continuation-in-part of Ser. No. 91,657, Jul. 14, 1993, Pat. No. 5,392,305.

[51] Int. Cl.$^6$ .............................. H01S 3/00; H01L 23/36
[52] U.S. Cl. .......................... 372/33; 372/34; 372/43; 372/49; 372/60; 372/99; 372/36; 372/33; 257/678; 257/682
[58] Field of Search ........................... 372/45, 34, 60, 372/99, 36, 33, 49; 257/678, 679, 682

[56] References Cited

U.S. PATENT DOCUMENTS

| | | | |
|---|---|---|---|
| 3,576,474 | 4/1971 | Huber et al. | 317/234 |
| 4,553,020 | 11/1985 | Val | 219/209 |
| 4,563,368 | 1/1986 | Tihanyi | 427/82 |
| 4,631,267 | 12/1986 | Lachman et al. | 502/439 |
| 4,631,731 | 12/1986 | Wolter et al. | 372/74 |
| 4,656,638 | 4/1987 | Tihanyi et al. | 372/49 |
| 4,769,345 | 9/1988 | Butt et al. | 437/217 |
| 4,980,137 | 12/1990 | Nelson et al. | 423/239 |
| 5,058,124 | 10/1991 | Cameron et al. | 372/34 |
| 5,144,634 | 9/1992 | Gasser et al. | 372/49 |
| 5,392,305 | 2/1995 | Jakobsen | 372/43 |
| 5,392,395 | 2/1995 | Jakobson | 372/43 |
| 5,513,198 | 4/1996 | Jakobson | 372/43 |

FOREIGN PATENT DOCUMENTS

| | | |
|---|---|---|
| 0025647 | 8/1980 | European Pat. Off. |
| 0237074 | 3/1987 | European Pat. Off. |
| 56-61761 | 5/1981 | Japan |
| 60-186076 | 9/1985 | Japan |
| 4-084480 | 3/1992 | Japan |
| 5-343812 | 12/1993 | Japan |

OTHER PUBLICATIONS

Philipp Schuessler and Stephen G. Gonya, "Hydrogen Desorption From Base and Processed Packaging Alloy", RL/NIST Workshop on Moisture Measurement and Control for Microelectronics, Gaithersburg, MD, Apr. 5–7, 1993.

"Requirement to Avert Packaging Induced Failure (PIF) of High Power 980 nm Laser Diodes", by Jakobson et al, published at LEOS, Nov. 1993.

"Military Standard —Certification Requirements For Hybrid Microcircuit Facilities and Lines", published in Statement Approved for Public Release, 15 May 1987 Department of Defense, MIL–STD–1772A.

"Considerations in the Hermetic Packaging of Hybrid Microcircuits" by Marjorie Byrnes, Jerry Carter, Jerry Sergent, and Dennis King in Solid State Technology publication, Aug. 1984, pp. 183–186.

(List continued on next page.)

*Primary Examiner*—Sara W. Crane
*Assistant Examiner*—David Ostrowski
*Attorney, Agent, or Firm*—Edward F. Murphy

[57] ABSTRACT

A package for a high power semiconductor laser comprising a hermetically sealed container filled with a dry gaseous medium containing oxygen. The presence of oxygen in the laser atmosphere is counter to standard practice in the art which teaches the use of an atmosphere of a dry inert gas. The package also includes a getter for organic impurities, e.g., a getter composed of a porous silica or a zeolite. The hydrogen content of the materials used to form the package are reduced by baking at an elevated temperature for an extended period of time, e.g., at 150° C. for 200 hours.

17 Claims, 2 Drawing Sheets

OTHER PUBLICATIONS

"Analysis of Rapid Degradation in High–Powered (AlGa) As Laser Diodes" by William J. Fritz published in IEEE Journal of Quantum Electronics, vol. 26, No. 1, Jan. 1990, pp. 68–74.

Guch et al, "Beyond Perfection: The Need for Understanding Contamination Effects on Real–World Optics", preprint from Oct. 27, 1993 Boulder Conference on Laser Packaging (Laser Systems Division of Litton Systems, Inc.).

Hovis et al, "Optical Damage at the Part Per Million Level: The Role of Trace Contamination in Laser Induced Optical Damage", preprint from Oct. 27, 1993 Boulder Conference on Laser Packaging (Laser Systems Division of Litton Systems, Inc.).

Ishikawa et al., "Outgassing Rate of Some Austenitic Stainless Steels", J. Vac. Sci. Technolog. A., 9:250–253, 1991.

Kenchington et al, "Oxygen Addition to the Annulus Gas Systems of Pickering NGS A, Units 3 and 4", Proceedings of the 10th Annual Conference of the Canadian Nuclear Society 3–1–3–5 1989.

Schuessler et al, "The Effects of Hydrogen on Device Reliability: and Insights on Preventing These Effects", Hybrid Circuit Technology, 8:19–26, 1991.

R. Szostak, "Handbook of Molecular Sieves", 1992 Van Nostrand Reinhold, pp. 92, 93, 117, 168, 169, 258, 278, 279, 284, 285, 343, 377, 393, 518.

Patent Abstracts of Japan, vol. 018 No. 174 (E–1530) Mar. 24, 1994, JP–A–5343812 (Kubota Corp) Dec. 24, 1993.

Patent Abstracts of Japan, vol. 009 No. 075 (E–306), Apr. 4, 1985, JP–A–59208860 (Hitachi Maikuro Computer Engineering KK; others: 01)Nov. 27, 1984.

Patent Abstracts of Japan, vol. 012 No. 191 (C–501), Mar. 6, 1988, JP–A–62297211 (Kanebo Ltd) Dec. 24, 1987.

J. S. Beck et al, "A New Family of Mesoporous Molecular Sieves Prepared With Liquid Crystal Templates", 1992 American Chemical Society, pp. 10834–10843.

Michael E. Leonowicz et al, "MCM–22: A Molecular Sieve With Two Independent Multidimensional Channel Systems", Science, vol. 264, 24 Jun. 1994, pp. 1910–1913.

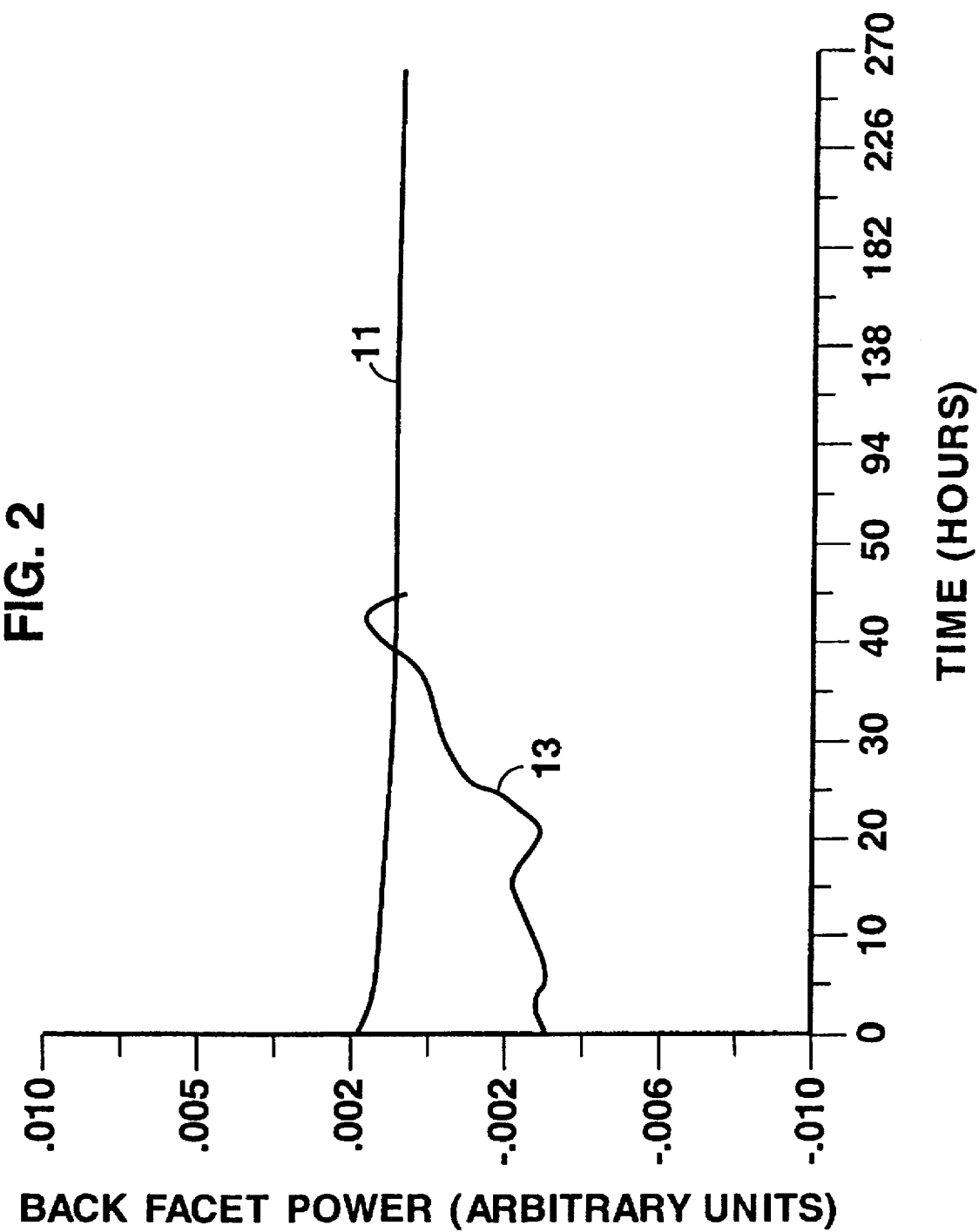

PACKAGING OF HIGH POWER SEMICONDUCTOR LASERS

CROSS-REFERENCE TO RELATED APPLICATION

This application is a divisional application of U.S. Ser. No. 08/168,125 filed Dec. 17, 1993, now U.S. Pat. No. 5,513,198 which is a continuation-in-part of U.S. application Ser. No. 08/091,657, filed Jul. 14, 1993, now U.S. Pat. No. 5,392,305.

BACKGROUND OF THE INVENTION

This invention relates to a package for a high power semiconductor laser and a method of packaging a high power semiconductor laser.

Semiconductor laser technology has matured to produce devices which are suitable for applications requiring long term, reliable laser operation. Strategies for maintaining laser stability and prolonging laser life include control of the laser operating environment. In particular, the temperature, humidity and atmosphere in which the laser operates are controlled. The preferred atmosphere taught in the prior art is relatively inert with respect to the semiconductor laser materials. In particular, the art teaches that an atmosphere free of oxygen extends laser life. Also a dry atmosphere is preferred to prevent reaction with the laser materials and to preserve the integrity of the miniature electric circuitry associated with the laser operation. For a further discussion of appropriate microcircuit packaging see, "Considerations in the Hermetic Packaging of Hybrid Microcircuits", Byrnes et al., *Solid State Technology*, 1984. For example, an atmosphere of dry nitrogen with a helium tracer provides a favorable laser operating environment. The term dry, as used in this document, in general refers to a gaseous medium having a water content less than about 5000 ppm. However, as semiconductor laser facet power has increased to 50 mW and higher, these generally accepted strategies for stable, long term laser operation have proved inadequate. For a laser having a facet size of about 2 microns by 1 micron, a power output of 50 mW translates into an average power density at the facet of the order of 1 megawatt/cm$^2$. Laser end facets, which essentially delimit the lasing cavity, can change in reflectivity and can even be destroyed when a high power laser is operated in a dry helium/nitrogen atmosphere. Materials which can contaminate the container include solder flux, oils, epoxies and cleaning agents used in the process. The term process is descriptive of the steps of producing a high powered semiconductor laser device. Their presence can result in particulate and gaseous contamination reaching the surface of the facet coatings, 9 or 5 in FIG. 1, and producing impurity deposits thereon. Such deposits can change the facet reflectivity, reducing transmitted power, and increasing absorptivity at the facet which causes facet heating and eventual laser failure. Therefore, new strategies are needed to meet those laser applications which require high power together with assurance of laser stability and longevity.

BRIEF DESCRIPTION OF THE INVENTION

The present invention meets the need for stable, long term, continuous operation of a high power semiconductor laser by providing an environment which is protective of the materials which comprise the laser. In this document, the terms "high power laser" and "high power semiconductor laser" refer to a semiconductor laser having a front facet power of at least 50 mW. Because the front facet of the laser is very small, an equivalent definition of high power may be expressed as a front facet power density of the order of 1 megawatt/cm$^2$ or higher.

One aspect of the invention is a packaged high power semiconductor laser comprising the laser surrounded by a hermetically sealed container filled with a gaseous medium containing at least 100 ppm oxygen. One embodiment of the invention utilizes a package containing air having less than 5000 ppm water as the gaseous medium. However, other embodiments are contemplated which have a gaseous medium comprising components relatively inert with respect to the semiconductor laser materials, and an amount of oxygen effective to prevent impurity depositions on the facet structure. The oxygen may act to substantially remove deposits from the laser facet structure or to react with impurities prior to deposition on the facet structure and so prevent deposits from forming thereon. Either the prevention of deposition on the laser facet structure or the removal of deposits on the laser facet structure may be generally termed the prevention of impurity induced damage to the laser facet structure. Because of the deleterious effects of water on microcircuits, very low water content, less than 1000 ppm, is preferred.

Another aspect of the invention is a method for hermetically sealing a high power semiconductor laser in a container filled with a gaseous medium. The laser is mounted on an optical platform. The optical platform is sealed in a hermetic container filled with a gaseous medium comprising components relatively inert with respect to the semiconductor laser materials and in addition containing an amount of oxygen effective to prevent impurity deposition on the laser facet structure. That is, the oxygen acts to prevent impurity induced laser structure damage. The water content of the gaseous medium is less than 5000 ppm. A preferred water content is 1000 ppm.

The invention is also directed to a high power semiconductor laser wherein the laser is enclosed in a hermetically sealed container filled with a gaseous medium containing at least 100 ppm oxygen. As stated above, the amount of oxygen is preferably an amount effective to prevent impurity depositions on the laser facet structure. An alternative mechanism is one in which the oxygen substantially removes impurities deposited on the laser facet structure.

A further aspect of the invention is a pump source for an optical waveguide fiber amplifier comprising a high power semiconductor laser wherein said laser is positioned in a hermetically sealed container filled with a dry gaseous medium containing at least 100 ppm of oxygen. One embodiment of the pump source comprises a semiconductor laser operating at 980 nm and having a front facet power of at least 50 mW. Alternatively, the semiconductor laser may be described as having an average power density at the front facet of about 1 megawatt/cm$^2$.

In one embodiment, the container is cleaned with isopropyl alcohol, a commercially available product, OPTICLEAR, or other suitable cleaning agent to remove residues of the manufacturing process, such as solder flux.

Further aspects of the invention relate to the incorporation of an adsorptive or absorptive getter material within the sealed container for the high power semiconductor laser. As discussed in detail below, the incorporation of oxygen in the container's gaseous medium significantly reduces the potential of damage to the laser's facets arising from residual organic impurities present in the container at the time of sealing. Although such an atmosphere substantially increases the useful life of high power semiconductor lasers, even further increases are achieved through the combination of an oxygen-containing atmosphere and a getter material which is capable of adsorbing or absorbing (trapping) organic materials. Such increased life is especially important for high power semiconductor lasers used in the field of telecommunications where life expectancies of ten years or more are required.

An additional aspect of the invention relates to the use of materials, specifically, metals, having a low hydrogen content to form the walls of the laser's container. The use of such materials provides the important advantage of minimizing water formation within the container as a result of reaction between hydrogen released from the walls of the container and the oxygen included in the container for impurity control. A preferred method for achieving the desired low hydrogen levels is to bake the container materials at an elevated temperature, e.g., about 150° C., for an extended period time, e.g., about 200 hours, prior to the assembly of the complete container.

BRIEF DESCRIPTION OF THE DRAWINGS

FIGS. 2 & 3 are charts illustrative of back facet power measured over time for semiconductor lasers packaged in a dry inert environment compared to lasers packaged in air.

DETAILED DESCRIPTION OF THE INVENTION

It will be understood that the drawings are illustrative of the invention and are useful in the description thereof, but are not necessarily intended to depict the entire invention or the relative size of the parts of the invention.

Figure 1:
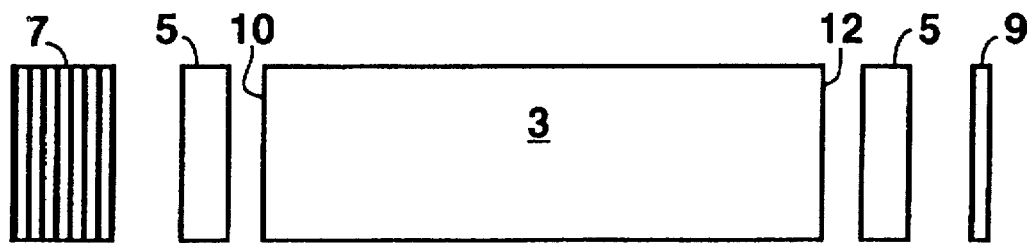
FIG. 1 is an exploded illustration of a semiconductor laser.

FIG. 1 illustrates the structure of a semiconductor laser, familiar to those skilled in the art. The front and back facets, 10 and 12 respectively, of laser body 3 are cleaved surfaces substantially parallel to one another. These facets are protected by passivation layers 5 which may be a layer of silicon. The passivation layer serves to protect the laser facet from contamination and erosion. The passivation layer also protects the laser facet from oxidation. The front facet mirror 9 is a coating of thickness approximately one quarter of the laser wavelength. The back facet mirror 7 is comprised of successive layers of reflective material, wherein adjacent layers are generally of different materials. The number, composition and thickness of the layers forming mirror 7 are chosen to give a target ratio of front facet to back facet transmitted power. A typical front to back facet power ratio is about 40:1.

A possible mechanism for failure of a semiconductor laser of the general type illustrated in FIG. 1 is as follows.

The emitting area at the laser facet may be of the order of 10 square microns or less. Thus when power levels reach or exceed about 50 mW, the number of photons crossing a unit area (photon flux) of a facet is comparatively large. The probability of a photon interacting with a trace impurity in the laser enclosure rises in proportion to the photon flux. Hence the probability increases for photon breakdown of impurity molecules on or near the facet mirror. Alternatively, the photon flux may excite labile or volatile impurity molecules on or near the facet mirror, thereby increasing the reactivity of the impurities, and possibly resulting in depositions on the facet mirror. Also, since high power semiconductor lasers are generally operated continuously, especially in telecommunications applications, once impurity molecules are deposited on the facet mirrors, the problem escalates rapidly through local heating as a result of absorption of the continuously impinging laser light at the location of the impurity.

The impurity molecules may originate from residues of soldering flux, epoxies, or cleaning materials, viz., isopropyl alcohol or OPTICLEAR (a brand name cleaning agent for optical materials) used in the fabricating process. With regard to epoxies, extended curing of this material helps reduce, but does not eliminate, impurity generation. Examples of organic chemicals found in these materials are propene, terpene and abietic acid. The action of the infrared photons on such carbon chains may be to strip off water, leaving a reactive carbon chain fragment which can bind to an atom in the material which makes up the facet mirror. Another mechanism is that the photons can strip hydrogen from the carbon chains thereby producing a reactive carbon chain fragment. Alumina and silicon nitride are examples of mirror materials. The presence of free oxygen in the laser container may protect the facet mirrors by binding to the reactive fragments before the fragments bond to the facet mirror. Or the oxygen may serve to quench excited states of reactive species thereby protecting the facet mirrors. An alternative possibility is that the free oxygen molecules break the "mirror-atom"-"carbon-chain-fragment" bond and thus remove the reactive fragment from the facet mirror. The oxygen thus may effectively act as a getter for impurity molecules.

In the above scenario, the amount of oxygen required to protect the facet mirror or facet structure would depend upon the number of impurity molecules as well as upon the number of other reactive sites present in the container which could bind to oxygen. The amount of oxygen required would also depend upon the kind of impurity molecules. Hence, the determination of the proper amount of oxygen to add to the gaseous medium filling the container would, in general, be experimental. Because of the known deleterious effects of oxygen, i.e., the reaction with hydrogen to form water which may undermine microcircuit integrity, the preferred amount of oxygen to add to the gaseous medium within the container is an amount just sufficient to maintain constant the properties of the facet structure.

The posited phenomena of impurity breakdown by photons would be most likely to occur at the higher power (higher photon flux) front facet. In the absence of free oxygen, the photo-reaction products could bind to or produce deposits on the facet structures, especially the mirror of the front facet. The deposits could change the reflectivity or absorptivity of the facet mirror. Increased absorptivity could increase the temperature at the facet to the melting point of the facet materials thereby destroying the facet. Also, increased temperature at the facet could cause junction migration in the bulk laser material, thereby destroying the laser. Thus, trace impurities which are essentially inconsequential at lower power levels, may become significant as the power level and associated photon flux increases. A successful strategy for realizing maximum laser life for lower photon flux lasers may become ineffective for higher photon flux lasers.

Assuming a photo-reaction is taking place, it is believed that a reactive gas, such as oxygen, present near a facet, binds to the reactive products of the photo-reaction, as described above, thereby preventing these reactive products from precipitating onto the facet mirror or removing the reactive products already bound to the facet mirror. Oxygen thus becomes a protective element of the laser atmosphere as opposed to a potential factor in shortening the life of the microcircuit as taught in prior art.

It will be understood that the validity of the mechanism described immediately above is not essential to the invention nor is the mechanism put forward as necessary to the function of the invention.

It was found, as will be explained in the examples below, that a standard procedure, for example MIL-STD-1772A, for laser packaging which includes cleaning the inside of the container with a substance such as isopropyl alcohol, filling the container with a dry inert gas, and hermetically sealing the laser container, produced unacceptably short laser life, of the order of several tens of hours, for high power lasers, i.e., lasers producing a front facet power of at least 50 mW.

Lasers packaged per the standard procedure, except that dry air was introduced into the laser enclosure atmosphere, showed acceptable life. Furthermore, certain lasers which had begun to degrade in power when operated in a dry inert atmosphere, were found to recover when an environment of air was introduced.

As discussed above, the atmosphere used to fill the laser enclosure preferably contains at least 100 ppm oxygen and less than about 1000 ppm of water. Commercially available "reconstituted air" is a suitable source for the atmosphere. For example, air product number 00.1 sold by Airco Gas Inc. of Portland, Oreg., can be used in the packaging of lasers in accordance with the invention. As reported by the manufacturer, this product has the following composition: ~20% $O_2$ (typical value); ~80% $N_2$ (typical value); 0.2 ppm CO (typical value); <0.1 ppm $CO_2$ (typical value); <0.1 ppm $NO_x$ (typical value); <0.1 ppm total hydrocarbons (guaranteed value); and <3 ppm $H_2O$ (guaranteed value).

In addition to packaging the laser in oxygen, an adsorptive or absorptive getter is also preferably included within the laser enclosure. Various getter materials can be used for this purpose. The material should have the following properties: 1) it should have a substantial adsorptive or absorptive capacity for organic impurities and preferably a substantial specific adsorptive or absorptive capacity so that only a limited amount of the material need be included in the laser enclosure; 2) its adsorptive or absorptive capacity should remain sufficient to protect the laser and its circuitry over the operating temperature range of the enclosure (e.g., over the range from about –40° C. to about 85° C.), so that substantial amounts of adsorbed or absorbed impurities are not released as the getter's temperature changes during use; 3) it should exhibit substantial physical integrity during shipping, handling and use, e.g., the material should release minimal dust or particulates that could adhere to the facet mirrors; and 4) organic contaminants should be readily removable from the material prior to introduction of the material into the container, i.e., the material should be purgable prior to use.

The amount of getter used for a particular laser enclosure will at least in part involve an empirical determination based on the specific properties of the getter material chosen for the laser package, the nominal amount of organic impurities within the enclosure at the time of sealing, and the volume of the enclosure. In general terms, for a getter material having a high specific surface area, e.g., a surface area on the order of 100 square meters per gram and an interconnected pore size distribution able to accommodate a substantial volume of organic compounds, approximately 0.1 grams of getter should be used for each $cm^3$ of enclosure.

Preferably, the getter material is used in block form to facilitate its incorporation in the laser enclosure. For example, a block of getter material can be mounted on the inside surface of the cover for the enclosure. In general, such mounting should not employ organic materials, e.g., epoxies or glues, but rather should be by mechanical means. For example, wire or spring clip or screw mounting can be used. Similarly, a mechanical solder attachment can be employed wherein, for example, through-holes are formed in the block of getter material, the getter is placed on the inside surface of the enclosure's cover, and the getter is soldered to the cover by pouring molten solder through the through-holes. Other means of attachment can, of course, be used if desired.

Examples of getter materials suitable for use in the practice of the invention include various porous silicas, such as the VYCOR brand porous silica sold by Corning Incorporated (Corning, N.Y.) under product number 7930, and various zeolites, such as the Na—Al—Si zeolite sold by W. R. Grace & Company under product number 10A. Mixtures of getter materials can be used in the practice of the invention if desired.

As discussed above, the oxygen within the packaging atmosphere serves the important function of minimizing laser damage by organic impurities. There is, however, a downside to using oxygen, namely, that it can react with hydrogen to form water within the laser enclosure. The water, in turn, can adversely affect the overall operation of the electronic components within the enclosure, including the semiconductor laser, by, for example, creating a short circuit between the conductors which interconnect the components. The use of a getter material which adsorbs or absorbs water in addition to organic impurities, such as the VYCOR material referred to above, can help to minimize this problem.

In accordance with the invention, the water problem is also addressed by reducing the amount of hydrogen available within the enclosure for reaction with the oxygen of the oxygen-containing atmosphere. The metals used to form the walls of the container are the main source of hydrogen within the enclosure. For example, a common material for use in constructing electronic enclosures is Kovar (an alloy of nickel and cobalt) electroplated with nickel and gold. During its manufacture, Kovar is normally annealed in hydrogen. Similarly, during the electroplating process, hydrogen is generated, which becomes absorbed in the metal. Over time, the hydrogen is released from the metal, reacts with the oxygen in the enclosure, and forms water. Accordingly, the hydrogen problem does not normally present itself initially, but rather develops as the semiconductor laser device ages after sealing in an atmosphere containing oxygen.

The invention addresses the hydrogen problem by pretreating the materials used to form the container. Specifically, the materials are baked at an elevated temperature and for an extended period of time in order to substantially reduce the amount of hydrogen adsorbed or absorbed therein. For example, in the case of Kovar plated with nickel and gold, the baking can take place at a temperature of about 150° C. for a period of about 200 hours. Further hydrogen reduction can be achieved by increasing the baking temperature to about 350° C., although in general such higher temperature processing is not required. The temperatures and times used for plated Kovar are also generally applicable to other materials known in the art for constructing sealed enclosures.

Comparative Example 1

A 980 nm InGaAs semiconductor laser was obtained from the IBM research facility in Zurich, Switzerland, with a structure substantially as shown in FIG. 1. The laser mirrors were configured to deliver 90% of total power through the front facet and 10% through the back facet. The laser was operated at a drive current of 195 mA which produced a front facet power of 150 mW. The laser was enclosed in a hermetically sealed container filled with a mixture of He/N in the ratio 1:9. Prior to sealing, the container was cleaned with isopropyl alcohol and with OPTICLEAR. Water content of the atmosphere surrounding the laser was <1000 ppm.

Figure 4:
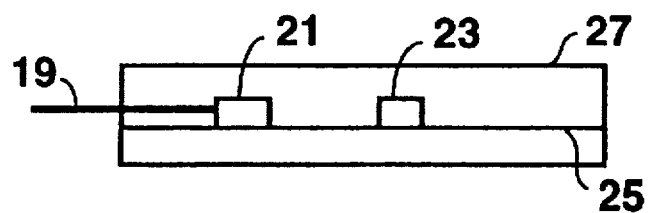
FIG. 4 is a side view, cut-away illustration of a laser device mounted within a container.

A semiconductor photodiode sensitive to the 980 nm wavelength was used to continuously monitor back facet power over time. Because of the front to back facet power ratio chosen for the laser, a small increase in front mirror reflectivity which produces only a small decrease in front facet power produces a proportionately larger increase in back facet power. Hence the back facet monitor is sensitive to small changes in front facet reflectivity. FIG. 4 is a cut away illustration of laser 21 and back facet photodiode 23 mounted on platform 25. The arrangement is sealed inside container 27.

Referring to FIG. 2, line 13 shows the back facet power increase observed during approximately 45 hours of testing of the device of Comparative Example 1 with a He/N atmosphere. The sharp upward trend is indicative of an increase in front facet reflectivity and thus a premature laser failure.

Comparative Example 2

Line 11 of FIG. 2 shows the back facet power measured for a laser, essentially identical to the laser of Comparative Example 1, packaged using the same procedure as for the Example 1 laser except that the dry He/N mixture is replaced by air. After 264 hours the back facet power curve is normal, indicative of a normal laser life expectancy.

Comparative Example 3

Figure 3:
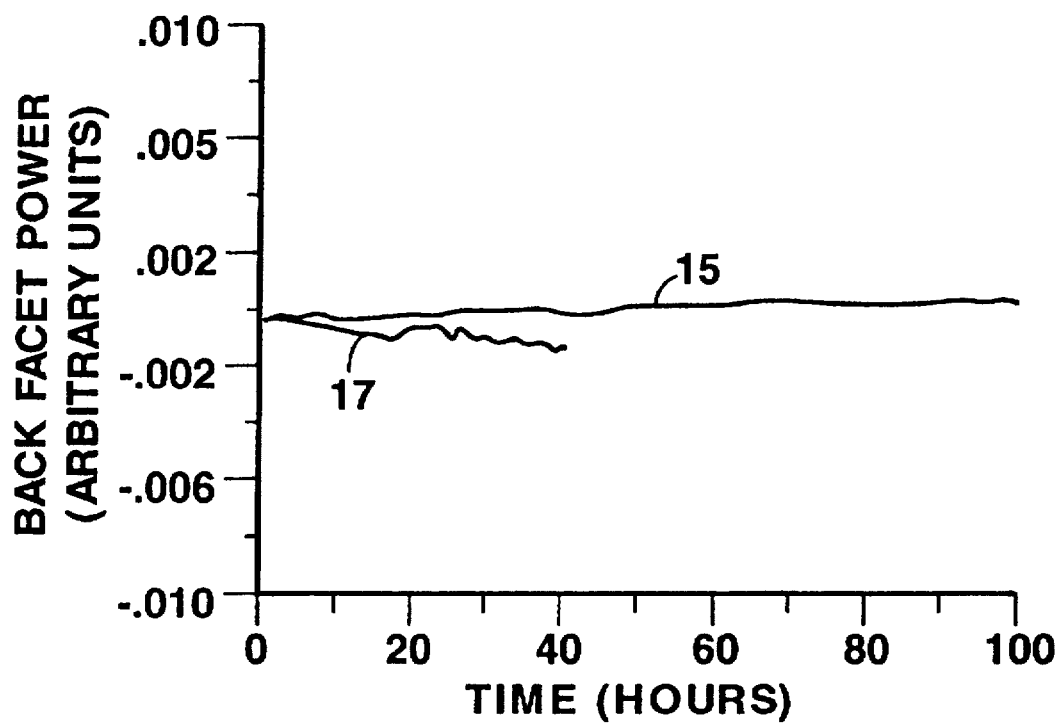

A 980 nm InGaAs laser was packaged in a dry inert atmosphere as described in Example 1. Again drive current was about 195 mA and initial front facet power was about 150 mW. Referring to FIG. 3, line 15 shows a monotonic increase in back facet power. The data is predictive of premature laser failure. The testing was stopped at about 100 hours, before failure of the laser.

Comparative Example 4

The laser container of Example 3 was punctured in ambient air, breaking the hermetic seal of the container to allow ingress of the ambient air. The laser drive current was reapplied and back facet power monitoring was resumed. Line 17 shows the back facet power decreasing to nominal level and then continuing with a normal aging slope. A normal aging slope is about 5% decrease in back facet power in 500 hours. That is, the laser back facet power decreases about 5% in the first 500 hours of operation.

Repeated tests of lasers in dry air showed the superiority of that atmosphere over the atmosphere of the dry He/N mixture.

It is believed that oxygen levels as low as 100 ppm may be sufficient to maintain the integrity of the laser facet mirror since thorough cleaning of the container can reduce vapor impurities to very low levels. In general, organic impurities may be minimized by cleaning. Conversely, if vapor impurity levels are relatively higher, oxygen levels should be increased to stoichiometrically react with the impurity molecules present. Preferably the oxygen concentration is such that the reaction to form the non-harmful oxidized products of the organic impurities is strongly favored thermodynamically. In this case the amount of oxygen would be greater than the stoichiometric amount.

The other elemental and compound gases, which in addition to oxygen make up air, are not believed to be preferred in preserving the integrity of the high power laser facet structure. Thus a mixture of oxygen with numerous commonly known gases would serve as a suitable gaseous medium for a high power semiconductor laser. For example a mixture of argon, helium or nitrogen and oxygen would constitute a suitable atmosphere for the laser.

Optical waveguide amplifier fiber 19 in FIG. 4 is shown coupled to the front facet of laser 21 and passing through the wall of container 27. This configuration is typical of a pump laser providing power to an amplifier fiber.

EXAMPLE 5

A 980 nm InGaAs semiconductor laser of the type described in Example 1, along with other components for using the laser to provide power to an amplifier fiber, are packaged along with a VYCOR glass getter (product number 7930) in a low-hydrogen Kovar container filled with an oxygen-containing atmosphere as follows.

The container for the laser is fabricated from Kovar plated with gold and nickel in two sections—a body section for holding the laser and other components and a cover for carrying the VYCOR getter. The two sections are baked in a $N_2$ purged oven at 150° C. for 200 hours. The internal volume of the container is approximately 5 $cm^3$.

The VYCOR getter is baked at 650° C. for at least 0.5 hours to activate the material and to remove previously adsorbed or absorbed organics. A section of the material having a weight of approximately 0.75 grams is attached to the previously baked cover using through-holes formed in the getter as described above.

The semiconductor laser and other components are mounted in the body section of the container. That section along with the cover section with its attached getter are then vacuum baked for 12 hours at 100° C. Finally, the two sections are sealed together in an atmosphere of the 00.1 air product referred to above. The sealing is performed by fluxless, electro-resistance heating.

The semiconductor laser is found to operate successfully over an extended period of time, i.e., for over 5000 hours, with minimal free water in the package, i.e., a water concentration in the package atmosphere of less than 5000 ppm at the end of the test period. The packaged high power semiconductor laser is thus suitable for use in providing power to an amplifier fiber in a telecommunications system.

Although specific embodiments of the invention have hereinbefore been disclosed and described, it will be understood that the scope of the invention is nevertheless to be defined by the following claims.

What is claimed is:

1. A packaged high power semiconductor laser comprising: a semiconductor laser which comprises a GaAs substrate said laser having an operating optical power of at least 50 milliwatts;

a getter tier adsorbing or absorbing organic impurities; and a hermetically sealed container surrounding said laser and said getter, said container being filled with a gaseous medium whose oxygen content is greater than 100 ppm.

2. The packaged high power semiconductor laser of claim 1 wherein the container comprises a material which has been subjected to a hydrogen reduction process.

3. The packaged high power semiconductor laser of claim 2 wherein the hydrogen reduction process comprises baking the material at an elevated temperature.

4. The packaged high power semiconductor laser of claim 3 wherein the material is baked at a temperature of about 150° C. for about 200 hours.

5. The packaged high power semiconductor laser of claim 1 wherein the getter is selected from the group consisting of porous silicas and zeolites.

6. The packaged high power semiconductor laser of claim 1 wherein the container has a cover and the getter is carried by the cover.

7. The packaged high power semiconductor laser of claim 6 wherein the getter is mechanically attached to the cover.

8. The packaged high power semiconductor laser of claim 1 wherein:

said gaseous medium comprises components relatively inert with respect to the materials of said high power semiconductor laser;

said high power semiconductor laser has a facet structure; and said oxygen content is an amount effective to substantially prevent impurity induced damage to said facet structure.

9. The packaged high power semiconductor laser of claim 1 wherein the water content of said gaseous medium is less than 5000 ppm.

10. A device for pumping an optical waveguide amplifier fiber comprising:

a high power semiconductor laser which comprises a GaAs substrate, said laser having an operating optical power of at least 50 milliwatts;

an optical waveguide fiber optically coupled to said high power semiconductor laser;

a getter for adsorbing or absorbing organic impurities; and a hermetically sealed container surrounding said laser and said getter, said container being filled with a gaseous medium whose oxygen content is greater than 100 ppm.

11. The device of claim 10 wherein the container comprises a material which has been subjected to a hydrogen reduction process.

12. The device of claim 11 wherein the hydrogen reduction process comprises baking the material at an elevated temperature.

13. The device of claim 10 wherein the getter is selected from the group consisting of porous silicas and zeolites.

14. The device of claim 10 wherein the container has a cover and the getter is carried by the cover.

15. The device of claim 14 wherein the getter is mechanically attached to the cover.

16. The device of claim 10 wherein the high power semiconductor laser is operated substantially continuously at a front facet power of at least 50 mW.

17. The device of claim 10 wherein the high power semiconductor laser has a facet structure and the amount of said oxygen is effective to substantially prevent impurity induced damage to said facet structure.

* * * * *

UNITED STATES PATENT AND TRADEMARK OFFICE
CERTIFICATE OF CORRECTION

PATENT NO. : 5,629,952
DATED : May 13, 1997
INVENTOR(S) : Douglas W. Hall; Paul A. Jakobson; Julia A. Sharps; Roger E. Bartholomew It is certified that error appears in the above-indentified patent and that said Letters Patent is hereby corrected as shown below:

Col. 8, line 62, "tier"  Claim 1
should be "for"

Signed and Sealed this

Ninth Day of September, 1997

*Attest:*

BRUCE LEHMAN

*Attesting Officer*     Commissioner of Patents and Trademarks